(12) United States Patent
Ramanathan et al.

(10) Patent No.: US 10,519,547 B2
(45) Date of Patent: Dec. 31, 2019

(54) SUSCEPTOR DESIGN TO ELIMINATE DEPOSITION VALLEYS IN THE WAFER

(71) Applicant: Applied Materials, Inc., Santa Clara, CA (US)

(72) Inventors: Karthik Ramanathan, Bangalore (IN); Kartik Shah, Sunnyvale, CA (US); Nyi O. Myo, San Jose, CA (US); Schubert S. Chu, San Francisco, CA (US); Jeffrey Tobin, Mountain View, CA (US); Errol Antonio C. Sanchez, Tracy, CA (US); Palamurali Gajendra, Bangalore (IN)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 15/000,971

(22) Filed: Jan. 19, 2016

(65) Prior Publication Data

US 2016/0215393 A1 Jul. 28, 2016

Related U.S. Application Data

(60) Provisional application No. 62/193,843, filed on Jul. 17, 2015.

(30) Foreign Application Priority Data

Jan. 23, 2015 (IN) .............................. 353/CHE/2015

(51) Int. Cl.
*C23C 16/458* (2006.01)
*H01L 21/687* (2006.01)
*H01L 21/67* (2006.01)

(52) U.S. Cl.
CPC .... *C23C 16/4583* (2013.01); *H01L 21/67115* (2013.01); *H01L 21/68735* (2013.01)

(58) Field of Classification Search
None
See application file for complete search history.

(56) References Cited

U.S. PATENT DOCUMENTS 5,403,401 A * 4/1995 Haafkens ............ H01L 21/6875
118/500
5,531,835 A * 7/1996 Fodor ................. H01L 21/6831
118/500

(Continued)

FOREIGN PATENT DOCUMENTS

| CN | 101228612 A | 7/2008 |
| CN | 103443904 A | 12/2013 |

(Continued)

OTHER PUBLICATIONS

PCT Notification of Transmittal of the International Search Report and the Written Opinion of the International Searching Authority for International Application No. PCT/US2015/067485; dated Apr. 29, 2016; 11 total pages.

(Continued)

*Primary Examiner* — Binu Thomas
(74) *Attorney, Agent, or Firm* — Patterson + Sheridan LLP

(57) ABSTRACT

Embodiments of the present disclosure generally relate to a susceptor for thermal processing of semiconductor substrates. In one embodiment, the susceptor includes a first rim, an inner region coupled to and surrounded by the first rim, and one or more annular protrusions formed on the inner region. The one or more annular protrusions may be formed on the inner region at a location corresponding to the location where a valley is formed on the substrate, and the one or more annular protrusions help reduce or eliminate the formation of the valley.

15 Claims, 6 Drawing Sheets

(56) References Cited

U.S. PATENT DOCUMENTS

| | | | | |
|---|---|---|---|---|
| 6,634,882 B2* | 10/2003 | Goodman | ............ | C23C 16/4581 |
| | | | | 211/41.18 |
| 6,648,976 B1* | 11/2003 | Matsuda | ............. | H01L 21/6875 |
| | | | | 118/725 |
| 2005/0000449 A1* | 1/2005 | Ishibashi | ............. | C23C 16/4585 |
| | | | | 118/728 |
| 2006/0180084 A1* | 8/2006 | Blomiley | ............. | C23C 16/4586 |
| | | | | 118/725 |
| 2006/0180086 A1* | 8/2006 | Kanaya | ............... | C23C 16/4584 |
| | | | | 118/728 |
| 2006/0222481 A1* | 10/2006 | Foree | .................. | H01L 21/6838 |
| | | | | 414/800 |
| 2007/0037390 A1 | 2/2007 | Tsuji et al. | | |
| 2007/0128888 A1* | 6/2007 | Goto | ................... | H01L 21/6838 |
| | | | | 438/795 |
| 2009/0056112 A1* | 3/2009 | Kobayashi | ............. | H02N 13/00 |
| | | | | 29/739 |
| 2011/0209660 A1* | 9/2011 | Myo | ................... | C23C 16/4586 |
| | | | | 118/728 |
| 2011/0303154 A1* | 12/2011 | Kim | .................. | H01L 21/68764 |
| | | | | 118/728 |
| 2012/0003599 A1* | 1/2012 | Patalay | ............. | H01L 21/67115 |
| | | | | 269/287 |
| 2012/0160419 A1 | 6/2012 | Lee et al. | | |
| 2013/0109192 A1* | 5/2013 | Hawkins | ............. | C23C 16/4585 |
| | | | | 438/758 |
| 2014/0113458 A1* | 4/2014 | Pan | ..................... | H01L 21/6835 |
| | | | | 269/289 R |
| 2014/0290564 A1 | 10/2014 | Miyashita | | |
| 2015/0340266 A1* | 11/2015 | Ngo | .................. | H01L 21/67326 |
| | | | | 165/185 |
| 2016/0133504 A1* | 5/2016 | Chu | .................. | H01L 21/68735 |
| | | | | 165/146 |

FOREIGN PATENT DOCUMENTS

| | | |
|---|---|---|
| CN | 104205320 A | 12/2014 |
| KR | 10-1390474 B1 | 5/2014 |

OTHER PUBLICATIONS

Chinese Office Action for Application No. 201580073239.4; dated Jun. 25, 2019; 9 total pages.

* cited by examiner

SUSCEPTOR DESIGN TO ELIMINATE DEPOSITION VALLEYS IN THE WAFER

CROSS-REFERENCE TO RELATED APPLICATIONS

This application claims priority to Indian Provisional Patent Application Serial No. 353/CHE/2015, filed on Jan. 23, 2015 and to U.S. Provisional Patent Application Ser. No. 62/193,843, filed on Jul. 17, 2015, which herein are incorporated by reference.

BACKGROUND

Field

Embodiments of the present disclosure generally relate to a susceptor for use in a thermal process chamber.

Description of the Related Art

Semiconductor substrates are processed for a wide variety of applications, including the fabrication of integrated devices and microdevices. During processing, the substrate is positioned on a susceptor within a process chamber. Susceptors often have platter or dish-shaped upper surfaces that are used to support the substrate from below around the edges of the substrate while leaving a small gap between the remaining lower surface of the substrate and the upper surface of the susceptor. The susceptor is supported by a support shaft, which is rotatable about a central axis. Precise control over a heating source, such as a plurality of heating lamps disposed below the susceptor, allows a susceptor to be heated within very strict tolerances. The heated susceptor can then transfer heat to the substrate, primarily by radiation emitted by the susceptor. The temperature of the substrate can affect the uniformity of the material deposited on the substrate.

Despite the precise control of heating the susceptor, it has been observed that valleys (lower deposition) are formed at certain locations on the substrate. Therefore, a need exists for an improved susceptor for supporting and heating substrates in semiconductor processing.

SUMMARY

Embodiments of the present disclosure generally relate to a susceptor for use in a thermal process chamber. In one embodiment, the susceptor includes a rim, an inner region coupled to and surrounded by the rim, and one or more annular protrusions formed on the inner region.

In another embodiment, a susceptor includes an inner region and one or more annular protrusions formed on the inner region. Each of the one or more annular protrusions includes an inner radius portion, an outer radius portion extending radially outward from the inner radius portion, and a linear portion between the inner radius portion and the outer radius portion.

In another embodiment, a process chamber includes a first dome, a second dome, and a base ring disposed between the first dome and the second dome. An internal region is defined by the first dome, the second dome and the base ring. The process chamber further includes a susceptor disposed in the internal region, and the susceptor includes a rim, an inner region coupled to and surrounded by the rim, and one or more annular protrusions formed on the inner region.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized in other embodiments without specific recitation.

DETAILED DESCRIPTION

Embodiments of the present disclosure generally relate to a susceptor for thermal processing of semiconductor substrates. In one embodiment, the susceptor includes a first rim, an inner region coupled to and surrounded by the first rim, and one or more annular protrusions formed on the inner region. The one or more annular protrusions may be formed on the inner region at a location corresponding to the location where a valley is formed on the substrate, and the one or more annular protrusions help reduce or eliminate the formation of the valley.

Figure 1:
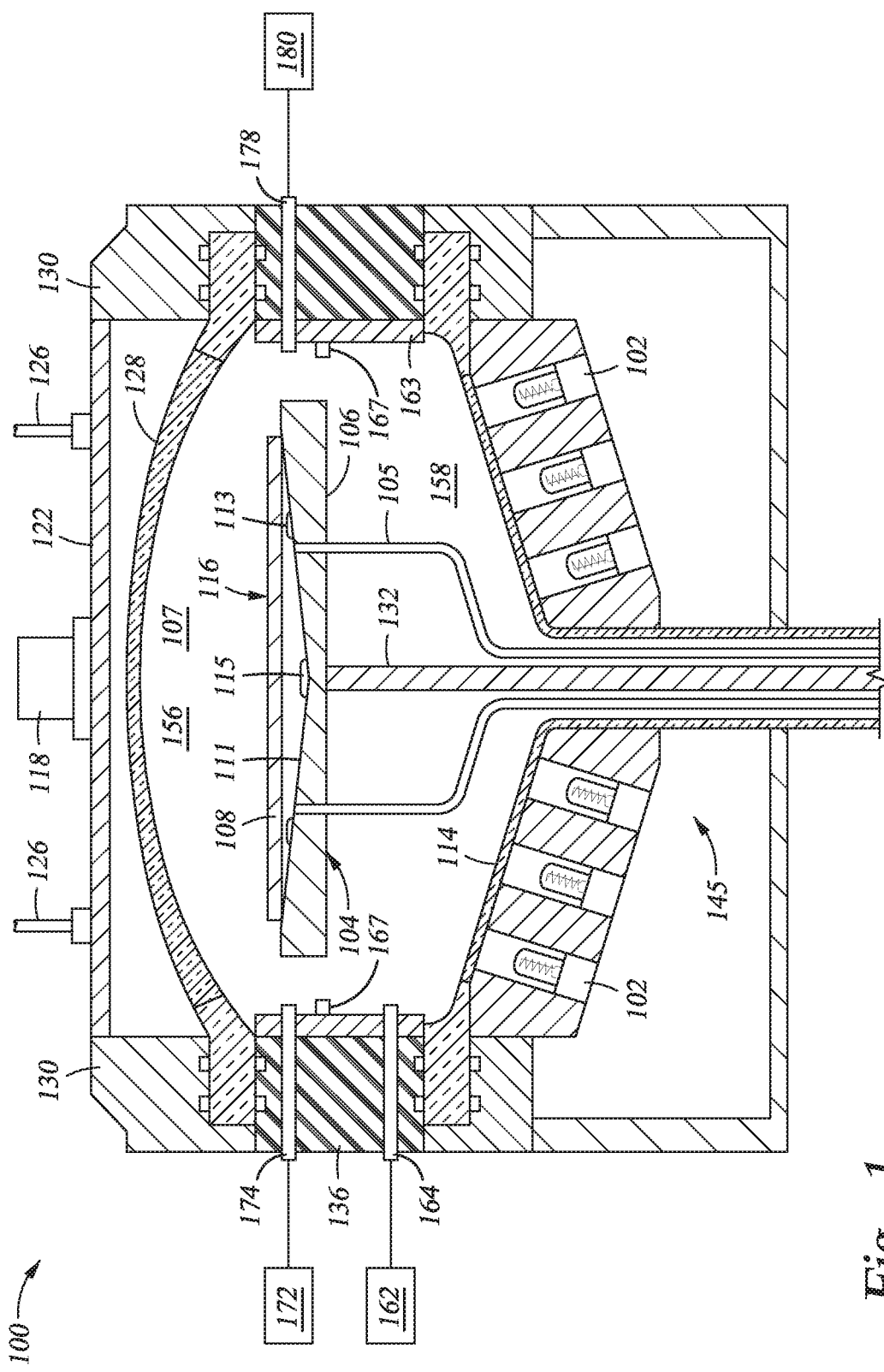
FIG. 1 is a schematic cross-sectional view of a process chamber according to one embodiment.

FIG. 1 illustrates a schematic sectional view of a process chamber 100 with components in position for processing that may be benefit from embodiments of the present disclosure. It is contemplated that while a process chamber for epitaxial process is shown and described, the concept of the present disclosure is also applicable to other process chamber that is capable of providing a controlled thermal cycle that heats the substrate for processes such as, for example, thermal annealing, thermal cleaning, thermal chemical vapor deposition, thermal oxidation and thermal nitridation, regardless of whether the heating elements are provided at the top, bottom, or both of the process chamber.

The process chamber 100 and any associated hardware may be formed from one or more process-compatible materials, such as stainless steel, quartz (e.g., fused silica glass), silicon carbide (SiC), CVD-coated SiC over graphite (e.g., 30-200 microns of SiC), and combinations and alloys thereof. The process chamber 100 may be used to process one or more substrates, including the deposition of a material on a deposition surface 116 of a substrate 108. The process chamber 100 may include a first dome 128, a second dome 114, and a base ring 136 located between the first dome 128 and the second dome 114. An internal region 107 is formed by the first dome 128, the second dome 114, and the base ring 136. The first dome 128 and the second dome 114 may be constructed from an optically transparent material, such as quartz. A susceptor 106 is disposed in the internal region 107 and the susceptor 106 divides the internal region 107 into a process region 156 and a purge region 158. The substrate 108 can be brought into the process chamber 100 through a loading port (not shown, obscured by the susceptor 106) and positioned on the susceptor 106. The susceptor 106 may be made of SiC coated graphite. The susceptor 106 has a first surface 111 facing the substrate 108 and a second surface 104 opposite the first surface 111. The susceptor 106 may be supported by a central shaft 132, which may be rotated by a motor (not shown), which in turn rotates the susceptor 106 and the substrate 108.

The susceptor 106, as shown in FIG. 1, is in a processing position to allow processing of the substrate 108 in the process chamber 100. The central shaft 132 and the susceptor 106 may be lowered by an actuator (not shown). A plurality of lift pins 105 passes through the susceptor 106. Lowering the susceptor 106 to a loading position below the processing position allows lift pins 105 to contact the second dome 114, pass through holes in the susceptor 106, and raise the substrate 108 from the susceptor 106. A robot (not shown) then enters the process chamber 100 to engage and remove the substrate 108 though the loading port (not shown). The robot or another robot enters the process chamber through the loading port and places an unprocessed substrate on the susceptor 106. The susceptor 106 then is raised to the processing position by the actuator to place the unprocessed substrate in position for processing.

The process chamber 100 may further include a lamphead assembly 145 having a plurality of radiant heating lamps 102. The lamphead assembly 145 may be disposed adjacent the second dome 114 external to the internal region 107 for heating, among other components, the second surface 104 of the susceptor 106, which in turn heats the substrate 108. One or more protrusions 113 may be disposed on the first surface 111. The one or more protrusions 113 may be annular and may be made of the same material as the susceptor 106. In some embodiments, a circular protrusion 115 may be disposed on the first surface 111, and the circular protrusion 115 may be made of the same material as the susceptor 106. The one or more protrusions 113 and the circular protrusion 115 may provide a localized temperature control on the substrate 108, thus providing deposition with improved uniformity on the deposition surface 116 of the substrate 108.

A preheat ring 167 may be optionally disposed around the susceptor 106 and surrounded by a liner assembly 163 that is coupled to the base ring 136. The preheat ring 167 prevents or reduces leakage of heat and or light noise from the lamps 102 to the deposition surface 116 of the substrate 108 while providing a pre-heat zone for the process gases. The preheat ring 167 may be made from chemical vapor deposited (CVD) SiC, sintered graphite coated with SiC, grown SiC, opaque quartz, coated quartz, or any similar, suitable material that is resistant to chemical breakdown by process and purging gases.

The liner assembly 163 is sized to be nested within or surrounded by an inner circumference of the base ring 136. The liner assembly 163 shields the metallic walls of the process chamber 100 from the process gases used in processing. The metallic walls may react with the process gases and be damaged or introduce contamination into the process chamber 100. While the liner assembly 163 is shown as a single body, in embodiments of the present disclosure, the liner assembly 163 may comprise one or more liners and other components.

In one embodiment, the process chamber 100 may also include one or more temperature sensors 118, such as optical pyrometers, which measure temperatures within the process chamber 100 and on the deposition surface 116 of substrate 108. A reflector 122 may be optionally placed outside the first dome 128 to reflect infrared light radiating from the substrate 108 and the first dome 128 back into the process region 156. The reflector 122 may be secured to the first dome 128 using a clamp ring 130. The reflector 122 may have one or more connection ports 126 connected to a cooling fluid source (not shown). The connection ports 126 may connect to one or more passages (not shown) within the reflector to allow cooling fluid (e.g., water) to circulate within the reflector 122.

The process chamber 100 may include a process gas inlet 174 connected to a process gas source 172. The process gas inlet 174 may be configured to direct process gas generally across the deposition surface 116 of the substrate 108. The process chamber 100 may also include a process gas outlet 178 located on the side of the process chamber 100 opposite the process gas inlet 174. The process gas outlet 178 is coupled to a vacuum pump 180.

In one embodiment, the process chamber 100 includes a purge gas inlet 164 formed in the base ring 136. A purge gas source 162 supplies purge gas to the purge gas inlet 164. The process gas inlet 174, purge gas inlet 164, and process gas outlet 178 are shown for illustrative purposes, and the position, size, number of gas inlets and outlets, etc. may be adjusted to facilitate a uniform deposition of material on the substrate 108.

Figure 2A:
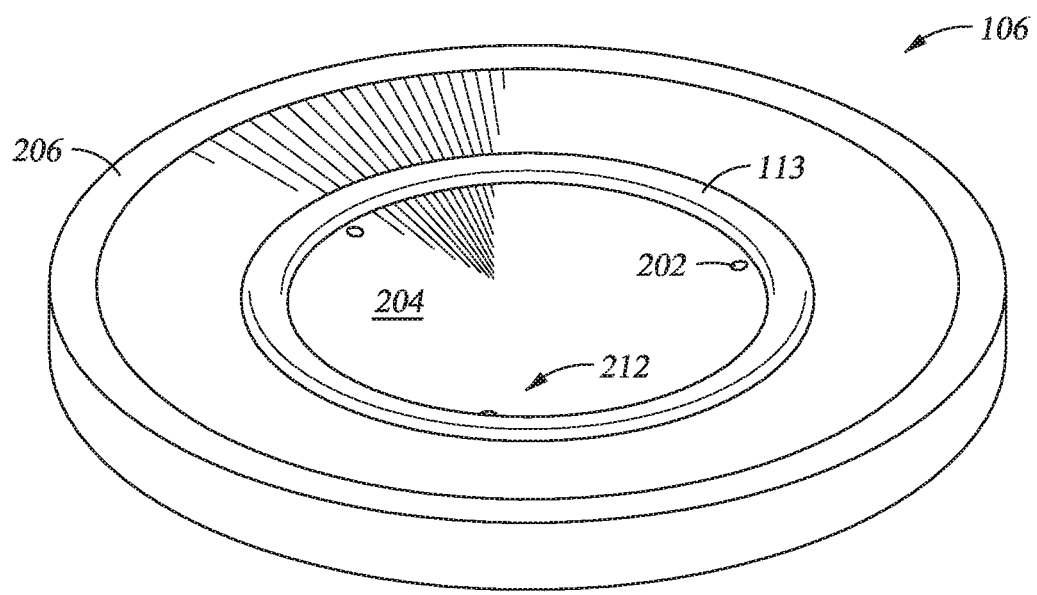
FIGS. 2A-2B are perspective views of a susceptor that is used in the process chamber according to embodiments of the disclosure.
Figure 2B:
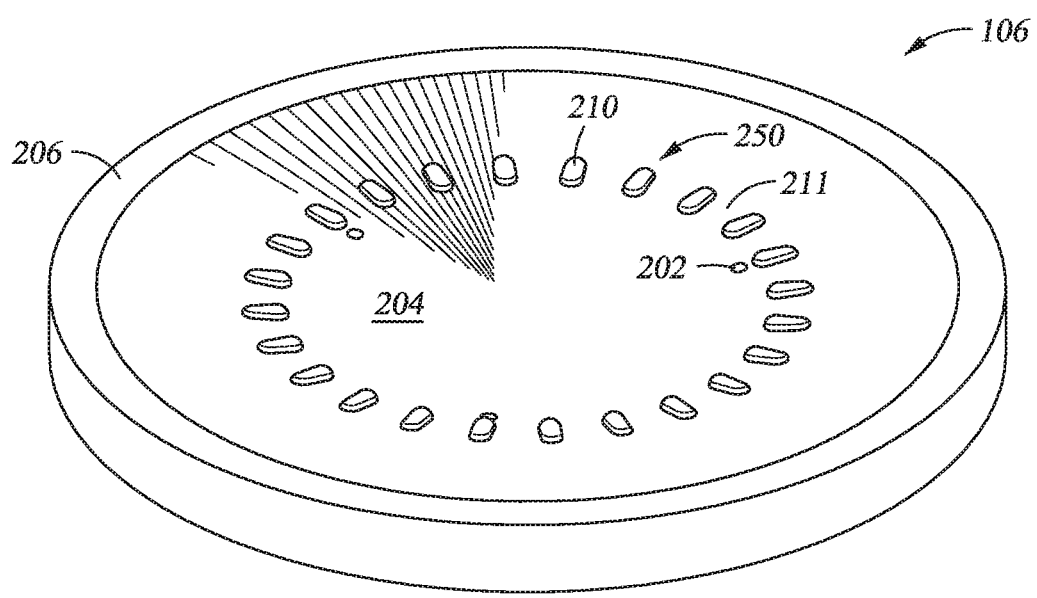

FIGS. 2A-2B are perspective views of the susceptor 106 according to various embodiments. As shown in FIG. 2A, the susceptor 106 may be a substantially circular plate including a rim 206 and an inner region 204 coupled to and surrounded by the rim 206. The first surface 111 (FIG. 1) may include both the inner region 204 and the rim 206. The inner region 204 may have a concave profile and may form a recessed pocket 212. The susceptor 106 may be sized so that the substrate to be processed on the susceptor 106 fits just inside the rim 206. The recessed pocket 212 thus prevents the substrate from slipping out during processing. The inner region 204 may include a number of through-holes 202, for example 3 through-holes, corresponding to the placement of the lift pins 105 (FIG. 1). The through-holes 202 allow the lift pins 105 to pass through the susceptor 106 to raise or lower the substrate from the susceptor 106. The through-holes 202 may be arranged at 120 degree intervals in a circumferential direction. The protrusion 113 may be disposed on the inner region 204 and may be surrounded by the rim 206.

FIG. 2B is a perspective view of the susceptor 106 according to another embodiment. As shown in FIG. 2B, a protrusion 250 may include a plurality of discrete protrusions 210 instead of a continuous protrusion as show in FIG. 2A. The protrusion 250 may be annular and the word "annular" as used herein is defined to also include a ring shape formed by a plurality of pieces that may or may not be spaced apart. A gap 211 may be formed between adjacent discrete protrusions 210. The discrete protrusions 210 may or may not be identical. The number of discrete protrusions 210 and gaps 211, and the arc length of each discrete protrusion 210 may be based on the deposition profile on the deposition surface of the substrate.

Figure 2C:
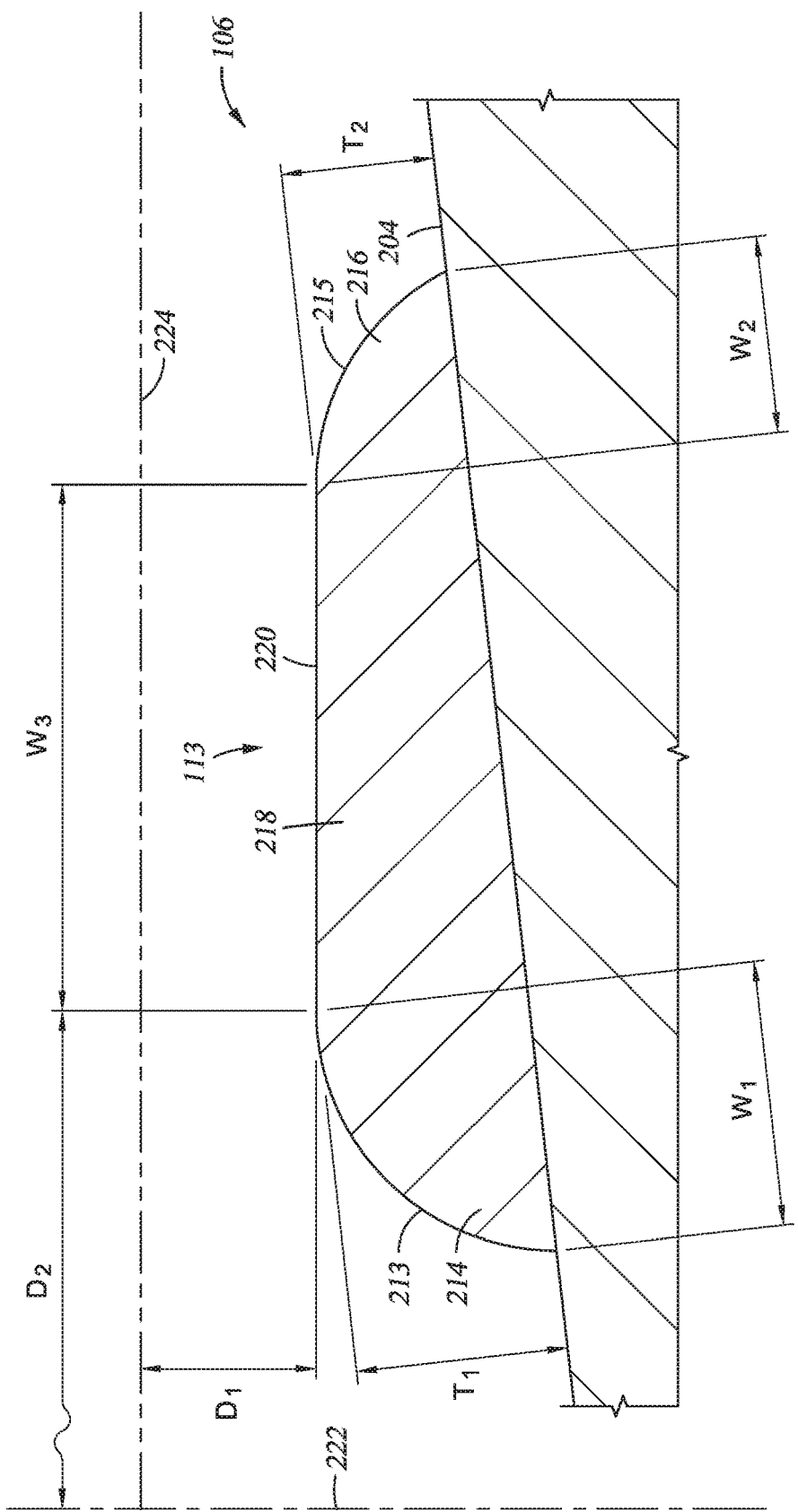
FIGS. 2C-2D are enlarged cross-sectional side views of a protrusion disposed on a susceptor that is used in the process chamber according to embodiments of the disclosure.

FIG. 2C is an enlarged cross-sectional view of the protrusion 113, or the protrusion 250, disposed on the susceptor 106 according to one embodiment. As shown in FIG. 2C, the protrusion 113 is disposed on the inner region 204 of the susceptor 106. The protrusion 113 includes an inner portion 214, an outer portion 216 extending radially outward from the inner portion 214, and a linear portion 218 between the inner portion 214 and the outer portion 216. The inner portion 214 and the outer portion 216 may be substantially parallel. In this sense, the word "parallel" describes a first path, which is a curve or a line, and a second path, where every point of the first path is a fixed distance, in a direction normal to the first path at the point, from a corresponding point of the second path. In one embodiment, the protrusion 113 is an annular protrusion, the inner portion 214 is an inner radius portion, and the outer portion 216 is an outer radius portion. The inner portion 214 may include a curved surface 213 having an arc that ends tangential to the linear portion 218. The inner portion 214 may have a width $W_1$ in millimeter range. The outer portion 216 may include a curved surface 215 having an arc that ends tangential to the linear portion 218. The outer portion 216 may have a width $W_2$ in millimeter range. The linear portion 218 may include a linear surface 220 having a linear cross-sectional profile. The linear portion 218 may have a width $W_3$ ranging from about 0.1 mm to about 65 mm, such as about 60 mm or 62 mm. Since the linear surface 220 might not be substantially parallel to the inner region 204 of the susceptor 106, the thickness of the linear portion 218 may vary. The portion of the linear portion 218 adjacent the inner portion 214 may have a thickness $T_1$ ranging from about 0.02 mm to about 0.20 mm. The portion of the linear portion 218 adjacent the outer portion 216 may have a thickness $T_2$ ranging from about 0.02 mm to about 0.15 mm.

The second surface 104 of the substrate 108 (FIG. 1) may define a plane 224. In one embodiment, the linear surface 220 may be substantially parallel to the plane 224, and a distance $D_1$ may be between the plane 224 and the linear surface 220. The distance $D_1$ may range from about 0.1 mm to about 0.2 mm, such as about 0.14 mm or 0.135 mm. During operation, the substrate 108 may bow toward the inner region 204 due to the heat. The distance $D_1$ is large enough so the substrate 108 does not contact the protrusion 113, but small enough so the protrusion 113 can increase the temperature of a localized area on the substrate 108 in order to minimize or eliminate the formation of a valley. The temperature of the localized area on the substrate 108 may be up to 7 degrees Celsius, such as about 4 degrees Celsius, higher than the temperature of the remaining area on the substrate 108. Such temperature increase reduces or eliminates the formation of the valley formed in the localized area on the substrate 108. The radial location of the protrusion 113 may correspond to the location of the valley formed on the substrate 108. In one embodiment, the radial distance $D_2$ between an axis of symmetry 222 of the susceptor 106 and the portion of the linear portion 218 adjacent the inner portion 214 ranges from about 35 mm to about 45 mm, such as about 38 mm or 40 mm.

Figure 2D:
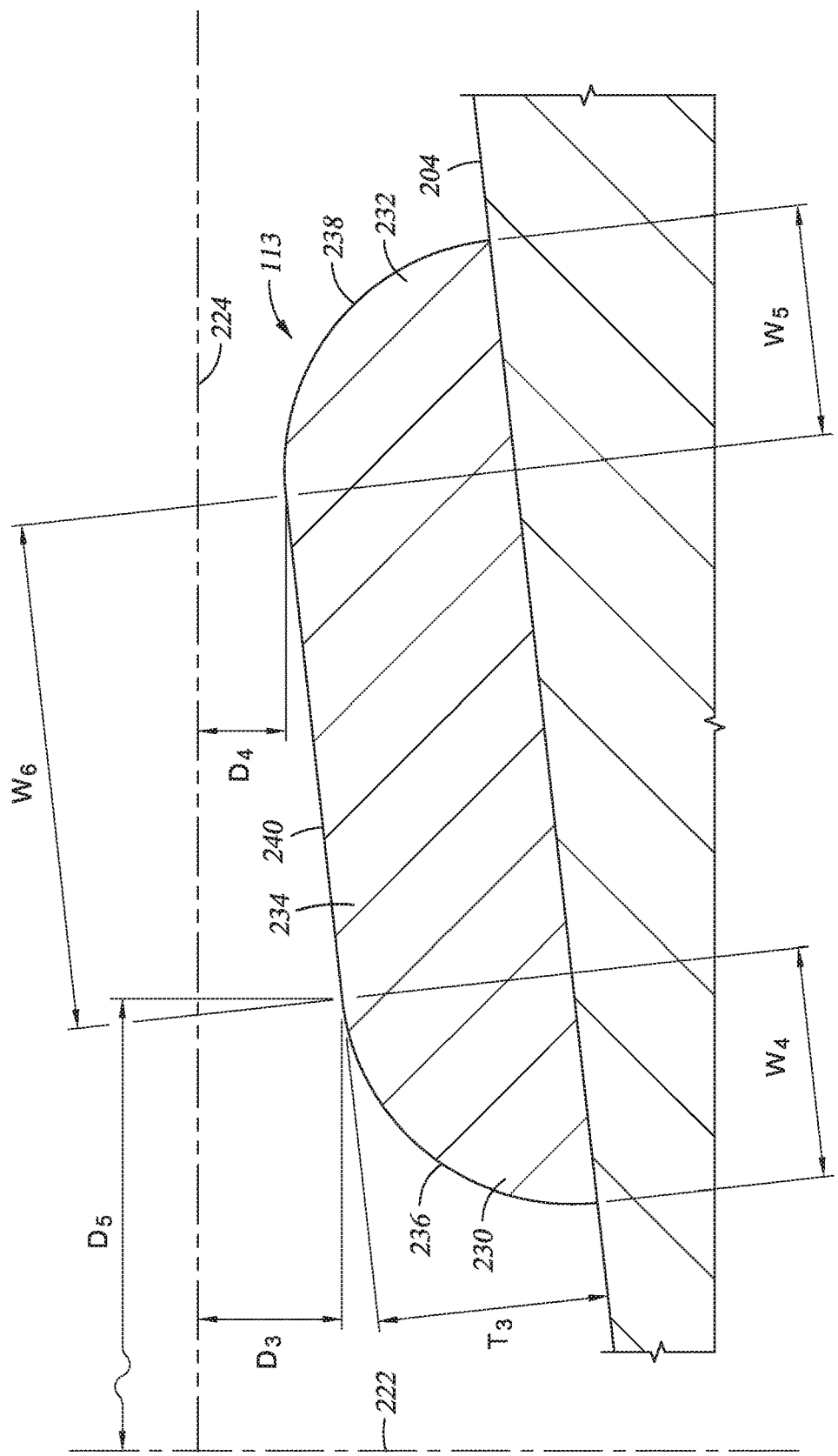

FIG. 2D is an enlarged cross-sectional view of the protrusion 113 disposed on the susceptor 106 according to one embodiment. As shown in FIG. 2D, the protrusion 113 is disposed on the inner region 204 of the susceptor 106. The protrusion 113 includes an inner portion 230, an outer portion 232 extending radially outward from the inner portion 230, and a linear portion 234 between the inner portion 230 and the outer portion 232. The inner portion 230 and the outer portion 232 may be substantially parallel. In one embodiment, the protrusion 113 is an annular protrusion, the inner portion 230 is an inner radius portion, and the outer portion 232 is an outer radius portion. The inner portion 230 may include a curved surface 236 having an arc that ends tangential to the linear portion 234. The inner portion 230 may have a width $W_4$ in millimeter range. The outer portion 232 may include a curved surface 238 having an arc that ends tangential to the linear portion 234. The outer portion 232 may have a width $W_5$ in millimeter range. The linear portion 234 may include a linear surface 240 having a linear cross-sectional profile. The linear portion 234 may have a width $W_6$ ranging from about 0.1 mm to about 65 mm, such as about 60 mm or 62 mm. The linear surface 240 may be substantially parallel to the inner region 204. The linear portion 234 may have a thickness $T_3$ ranging from about 0.02 mm to about 0.20 mm. Alternatively, the linear surface 240 may not be substantially parallel to the inner region 204, and the thickness of the linear surface 240 varies.

The distance between the plane 224 and the linear surface 240 may vary since the linear surface 240 is not parallel to the plane 224. The portion of the linear surface 240 adjacent the inner portion 230 may be a distance $D_3$ from the plane 224. The distance $D_3$ may range from about 0.1 mm to about 0.2 mm, such as 0.15 mm. The portion of the linear surface 240 adjacent the outer portion 232 may be a distance $D_4$ from the plane 224. The distance $D_4$ may be smaller than the distance $D_3$ and may range from about 0.1 mm to about 0.2 mm, such as 0.11 mm. Again the distances $D_3$ and $D_4$ are large enough so the substrate 108 does not contact the protrusion 113 during operation, but small enough so the protrusion 113 can increase the temperature of a localized area on the substrate 108 in order to minimize or eliminate the formation of a valley. In order to have the predetermined distances $D_3$ and $D_4$, the linear surface 240 may or may not be substantially parallel to the inner region 204. In one embodiment, the radial distance $D_5$ between the axis of symmetry 222 of the susceptor 106 and the portion of the linear portion 234 adjacent the inner portion 230 ranges from about 35 mm to about 45 mm, such as about 38 mm or 40 mm.

Figure 3A:
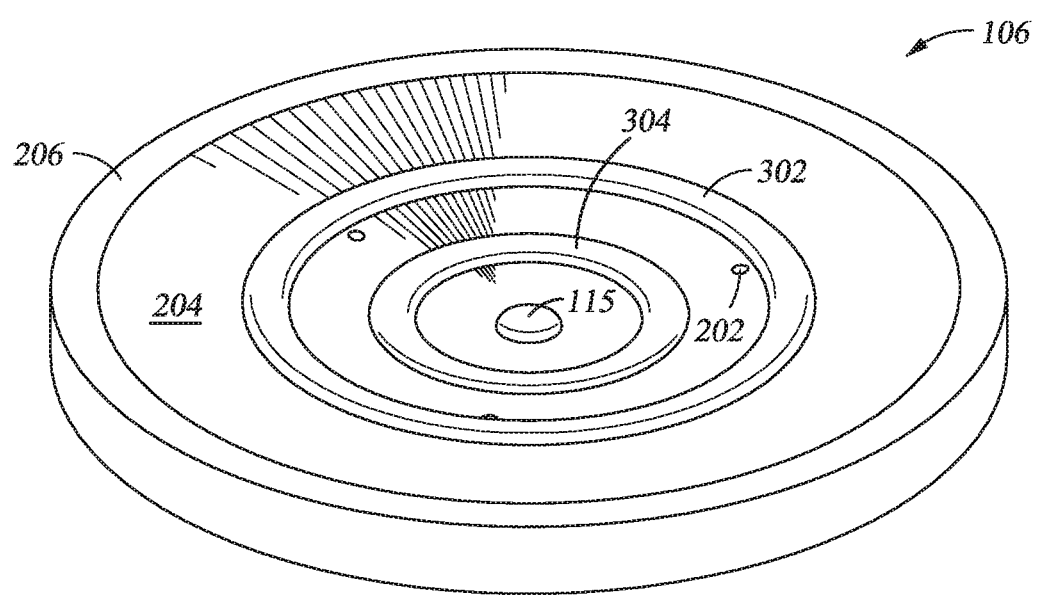
FIG. 3A is a perspective view of a susceptor that is used in the process chamber according to embodiments of the disclosure.

FIG. 3A is a perspective view of the susceptor 106 according to various embodiments. As shown in FIG. 3A, two protrusions 302, 304 and the circular protrusion 115 may be disposed on the inner region 204 and may be surrounded by the rim 206. The protrusions 302, 304 may be annular. Both protrusions 302, 304 may be concentric with the circular protrusion 115, which may be disposed at a center of the susceptor 106. The protrusions 302, 304 may each be a continuous protrusion or formed by a plurality of discrete protrusions. One protrusion may be a continuous protrusion while the other protrusion is formed by a plurality of discrete protrusions. In some embodiments, more than two protrusions are disposed on the inner region 204.

Figure 3B:
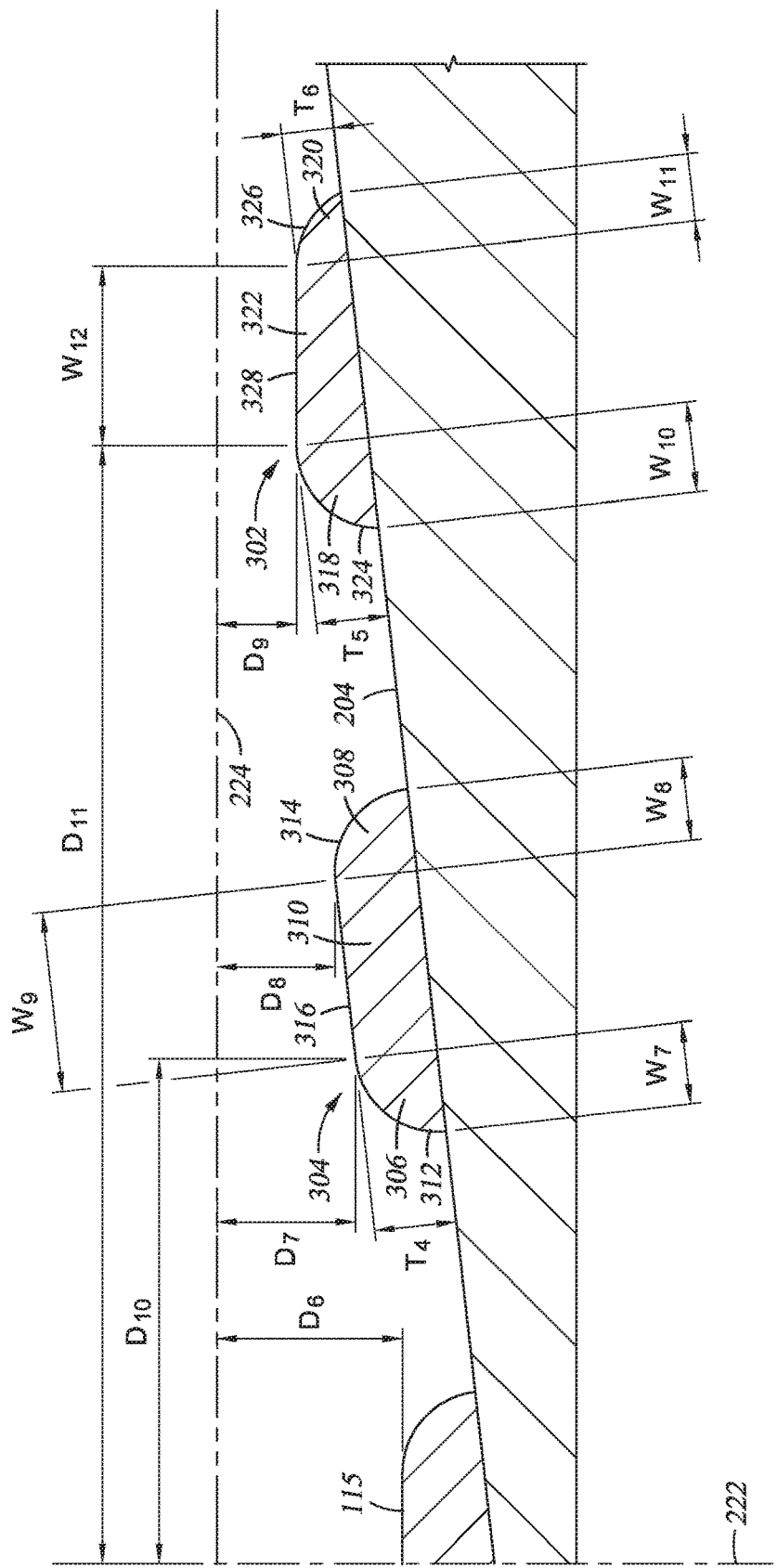
FIG. 3B is an enlarged cross-sectional side view of one or more protrusions and a circular protrusion disposed on a susceptor that is used in the process chamber according to embodiments of the disclosure.

FIG. 3B is an enlarged cross-sectional view of the protrusions 302, 304 and the circular protrusion 115 disposed on the susceptor 106 according to one embodiment. The circular protrusion 115 may have a diameter ranging from about 2 mm to about 5 mm and may be a distance $D_6$ from the plane 224. The distance $D_6$ may range from about 0.25 mm to about 0.35 mm. The protrusion 304 includes an inner portion 306, an outer portion 308 extending radially outward from the inner portion 306, and a linear portion 310 between the inner portion 306 and the outer portion 308. The inner portion 306 and the outer portion 308 may be substantially parallel. In one embodiment, the protrusion 304 is an annular protrusion, the inner portion 306 is an inner radius portion, and the outer portion 308 is an outer radius portion. The inner portion 306 may include a curved surface 312 having an arc that ends tangential to the linear portion 310. The inner portion 306 may have a width $W_7$ in millimeter range. The outer portion 308 may include a curved surface 314 having an arc that ends tangential to the linear portion 234. The outer portion 308 may have a width $W_8$ in millimeter range. The linear portion 310 may include a linear surface 316 having a linear cross sectional profile. The linear portion 310 may have a width $W_9$ ranging from about 0.1 mm to about 5 mm, such as about 5 mm. The linear surface 316 may be substantially parallel to the inner region 204. The linear portion 310 may have a thickness $T_4$ ranging from about 0.02 mm to about 0.20 mm. Alternatively, the linear surface 316 might not be substantially parallel to the inner region 204, and the thickness of the linear surface 316 varies.

The distance between the plane 224 and the linear surface 316 may vary since the linear surface 316 might not be parallel to the plane 224. The portion of the linear surface 316 adjacent the inner portion 306 may be a distance $D_7$ from the plane 224. The distance $D_7$ may range from about 0.2 mm to about 0.3 mm, such as 0.26 mm. The portion of the linear surface 316 adjacent the outer portion 308 may be a distance $D_8$ from the plane 224. The distance $D_8$ may be smaller than the distance $D_7$ and may range from about 0.2 mm to about 0.3 mm, such as 0.25 mm. Again the distances $D_7$ and $D_8$ are large enough so the substrate 108 does not contact the protrusion 304 during operation, but small enough so the protrusion 304 can increase the temperature of a localized area on the substrate 108 in order to minimize or eliminate the formation of a valley. In order to have the predetermined distances $D_7$ and $D_8$, the linear surface 316 may or may not be substantially parallel to the inner region 204. In some embodiments, the linear surface 316 may be substantially parallel to the plane 224 and the distance between the linear surface 316 and the plane 224 may range from about 0.2 mm to about 0.3 mm. In one embodiment, the radial distance $D_{10}$ between the axis of symmetry 222 of the susceptor 106 and the portion of the linear portion 310 adjacent the inner radius portion 306 ranges from about 30 mm to about 50 mm, such as about 40 mm or 45 mm.

As shown in FIG. 3B, the protrusion 302 includes an inner portion 318, an outer portion 320 extending radially outward from the inner portion 318, and a linear portion 322 between the inner portion 318 and the outer portion 320. The inner portion 318 and the outer portion 320 may be substantially parallel. In one embodiment, the protrusion 302 is an annular protrusion, the inner portion 318 is an inner radius portion, and the outer portion 320 is an outer radius portion. The inner portion 318 may include a curved surface 324 having an arc that ends tangential to the linear portion 322. The inner portion 318 may have a width $W_{10}$ in millimeter range. The outer portion 320 may include a curved surface 326 having an arc that ends tangential to the linear portion 322. The outer portion 320 may have a width $W_{11}$ in millimeter range. The linear portion 322 may include a linear surface 328 having a linear cross-sectional profile. The linear portion 322 may have a width $W_{12}$ ranging from about 0.1 mm to about 5 mm, such as about 5 mm. The linear surface 328 may be substantially parallel to the plane 224, as shown in FIG. 3B, or substantially parallel to the inner region 204. In one embodiment, since the linear surface 328 is not substantially parallel to the inner region 204 of the susceptor 106, the thickness of the linear portion 322 may vary. The portion of the linear portion 322 adjacent the inner portion 318 may have a thickness $T_5$ ranging from about 0.02 mm to about 0.20 mm. The portion of the linear portion 322 adjacent the outer portion 320 may have a thickness $T_6$ ranging from about 0.02 mm to about 0.15 mm. Alternatively, the linear portion 322 has a constant thickness ranging from about 0.02 mm to about 0.20 mm.

The distance $D_9$ between the plane 224 and the linear surface 328 may be constant since the linear surface 328 may be substantially parallel to the plane 224. The distance $D_9$ may range from about 0.1 mm to about 0.2 mm, such as about 0.16 mm. Alternatively, the distance $D_9$ varies if the linear surface 328 is not substantially parallel to the plane 224. Again the distance $D_9$ is large enough so the substrate 108 does not contact the protrusion 302 during operation, but small enough so the protrusion 302 can increase the temperature of a localized area on the substrate 108 in order to minimize or eliminate the formation of a valley. In one embodiment, the radial distance $D_{11}$ between the axis of symmetry 222 of the susceptor 106 and the portion of the linear portion 322 adjacent the inner portion 318 ranges from about 110 mm to about 130 mm, such as about 120 mm or 125 mm.

While the foregoing is directed to embodiments of the present disclosure, other and further embodiments of the disclosure may be devised without departing from the basic scope thereof, and the scope thereof is determined by the claims that follow.

The invention claimed is:

1. A susceptor, comprising:
  a rim;
  an inner region coupled to and surrounded by the rim, the inner region including an axis of symmetry and a surface profile, the surface profile extending from the axis of symmetry at a continuously inclined angle to the rim; and
  one or more annular protrusions formed on the inner region and radially spaced from the rim, each of the one or more annular protrusions includes:
  a convex inner radius portion;
  a convex outer radius portion extending radially outward from the convex inner radius portion; and
  a linear portion connecting the convex inner radius portion to the convex outer radius portion,
    wherein the convex inner radius portion and the convex outer radius portion each includes a curved surface having an arc that ends tangential to the linear portion,
    wherein the linear portion includes a first thickness adjacent the convex inner radius portion and a second thickness adjacent the convex outer radius portion, and the first thickness is different from the second thickness, and
    wherein at least one of the one or more annular protrusions includes the convex inner radius portion having a distance from the axis of symmetry that ranges from about 35 mm to about 45 mm or from about 110 mm to about 130 mm.

2. The susceptor of claim 1, wherein the one or more annular protrusions is a single continuous annular protrusion.

3. The susceptor of claim 1, wherein the one or more annular protrusions includes two continuous concentric annular protrusions.

4. The susceptor of claim 1, wherein the one or more annular protrusions includes a plurality of discrete protrusions spaced apart.

5. The susceptor of claim 1, further comprising a circular protrusion.

6. The susceptor of claim 1, wherein the linear portion has a width ranging from about 0.1 mm to about 65 mm.

7. A susceptor, comprising:
  a rim;

an inner region coupled to and surrounded by the rim, the inner region including an axis of symmetry and a surface profile, the surface profile extending from the axis of symmetry at a continuously inclined angle to the rim; and one or more annular protrusions formed on the inner region and radially spaced from the rim, at least one of the one or more annular protrusions including a convex inner radius portion having a distance from the axis of symmetry that ranges from about 35 mm to about 45 mm or from about 110 mm to about 130 mm, wherein each annular protrusion comprises:

the convex inner radius portion;

a convex outer radius portion extending radially outward from the convex inner radius portion; and a linear portion connecting the convex inner radius portion to the convex outer radius portion, wherein the linear portion includes a first thickness adjacent the convex inner radius portion and a second thickness adjacent the convex outer radius portion, and the first thickness is different from the second thickness, wherein the convex inner radius portion and the convex outer radius portion each includes a curved surface having an arc that ends tangential to the linear portion, and wherein the linear portion includes a linear surface having a linear cross-sectional profile.

8. The susceptor of claim 7, wherein the one or more annular protrusions is a single continuous annular protrusion.

9. The susceptor of claim 7, wherein the one or more annular protrusions includes two continuous concentric annular protrusions.

10. The susceptor of claim 9, further comprising a circular protrusion.

11. The susceptor of claim 7, wherein the one or more annular protrusions includes a plurality of discrete protrusions spaced apart.

12. A process chamber, comprising:

a first dome;

a second dome;

a base ring disposed between the first dome and the second dome, wherein an internal region is defined by the first dome, the second dome, and the base ring; and a susceptor disposed in the internal region, wherein the susceptor comprises:

a rim;

an inner region coupled to and surrounded by the rim, the inner region including an axis of symmetry and a surface profile, the surface profile extending from the axis of symmetry at a continuously inclined angle to the rim; and one or more annular protrusions formed on the inner region and radially spaced from the rim, wherein each of the one or more annular protrusions includes a convex inner radius portion, a convex outer radius portion extending radially outward from the convex inner radius portion, and a linear portion between the convex inner radius portion and the convex outer radius portion, and wherein the convex inner radius portion and the convex outer radius portion each includes a curved surface having an arc that ends tangential to the linear portion, wherein the linear portion includes a first thickness adjacent the convex inner radius portion and a second thickness adjacent the convex outer radius portion, and the first thickness is different from the second thickness, and wherein at least one of the one or more annular protrusions includes the convex inner radius portion having a distance from the axis of symmetry that ranges from about 35 mm to about 45 mm or from about 110 mm to about 130 mm.

13. The process chamber of claim 12, wherein the one or more annular protrusions is a single continuous annular protrusion.

14. The process chamber of claim 12, wherein the one or more annular protrusions includes two continuous concentric annular protrusions.

15. The susceptor of claim 7, wherein one or more annular protrusions receive heat from heat lamps, the one or more annular protrusions are adapted to increase temperature at localized areas on a substrate to reduce formation of a valley wherein, the linear portion has a width ranging from about 0.1 mm to about 65 mm, the linear portion adjacent the convex inner radius portion has a thickness ranging from 0.02 mm to about 0.20 mm, and the linear portion adjacent the convex inner radius portion is a distance, ranging from 0.1 mm to about 0.2 mm, from the convex inner radius portion to a plane formed by the rim.

* * * * *